US009039453B2

(12) United States Patent
Song

(10) Patent No.: US 9,039,453 B2
(45) Date of Patent: May 26, 2015

(54) ELECTRICAL CONNECTOR

(71) Applicant: Molex Incorporated, Lisle, IL (US)

(72) Inventor: Xiao-Jun Song, Shanghai (CN)

(73) Assignee: Molex Incorporated, Lisle, IL (US)

(*) Notice: Subject to any disclaimer, the term of this patent is extended or adjusted under 35 U.S.C. 154(b) by 0 days.

(21) Appl. No.: 14/096,760

(22) Filed: Dec. 4, 2013

(65) Prior Publication Data

US 2014/0187092 A1 Jul. 3, 2014

(30) Foreign Application Priority Data

Dec. 6, 2012 (CN) ...................... 2012 2 0667734 U

(51) Int. Cl.
*H01R 13/40* (2006.01)
*H01P 1/00* (2006.01)
*H01Q 1/00* (2006.01)
*H05K 1/00* (2006.01)

(52) U.S. Cl.
CPC .. *H01P 1/00* (2013.01); *H01Q 1/00* (2013.01); *H05K 1/00* (2013.01)

(58) Field of Classification Search
CPC .... H01R 12/716; H01R 12/79; H01R 13/631; H01R 12/52; H01R 12/88; H01R 13/26; H01R 12/57; H01R 12/707; H01R 13/20; H01R 13/24; H01R 13/41; H01R 13/6205; H01R 13/6275; H01R 13/6276; H01R 13/62955; H01R 13/62961; H01R 13/639
See application file for complete search history.

(56) References Cited

U.S. PATENT DOCUMENTS 4,906,957 A * 3/1990 Wilson .......................... 333/246
5,205,740 A * 4/1993 Frankeny et al. ............... 439/67
5,219,292 A * 6/1993 Dickirson et al. .............. 439/67
5,653,601 A * 8/1997 Martucci et al. ................ 439/82
6,079,990 A * 6/2000 Martucci et al. ................ 439/81
6,146,156 A * 11/2000 Yang .............................. 439/83
7,061,076 B2 6/2006 Shiffer
7,238,044 B2 * 7/2007 Uchida et al. ................ 439/492
7,621,756 B2 * 11/2009 Dittmann ........................ 439/66
7,815,475 B2 10/2010 Peloza et al.
8,137,144 B1 * 3/2012 Wang ........................... 439/844
2011/0201227 A1 * 8/2011 Takeuchi ...................... 439/374
2011/0256764 A1 * 10/2011 Wu .......................... 439/607.01

FOREIGN PATENT DOCUMENTS

TW M3921240 U1 10/2010

* cited by examiner

*Primary Examiner* — Briggitte R Hammond
(74) *Attorney, Agent, or Firm* — Stephen L. Sheldon

(57) ABSTRACT

An electrical connector includes a body, a trace, a terminal, and an engaging element. The body includes a recessed groove. The trace includes a first contact portion and a connection segment. The first contact portion is formed on a surface of the body and connected to the connection segment. The connection segment is formed on an inner surface of the recessed groove. The terminal is supported by the body and comprises a second contact portion. The terminal is partially exposed in the recessed groove and the second contact portion extends out of the body. The engaging element is provided in the recessed groove and electrically connect the connection segment and the terminal.

12 Claims, 13 Drawing Sheets

2 24 22 222 221 213 2111 211 21 23 232 233 214 231 233

ELECTRICAL CONNECTOR

RELATED APPLICATIONS

This application claims priority to Chinese Application No. 201220667734.1, filed Dec. 6, 2012, which is incorporated herein by reference in its entirety.

FIELD OF THE PRESENT DISCLOSURE

The present disclosure relates to an electrical connector.

BACKGROUND OF THE PRESENT DISCLOSURE

FIG. 1 is an earphone plug 1 with an antenna disclosed in Taiwanese Utility Model application, publication number of which is M391240. The earphone plug 1 comprises an earphone header 12 and a sleeve type antenna 13. The earphone header 12 is provided with a conductive terminal 121, the conductive terminal 121 has a protruding portion 1211 bent sideward. The sleeve type antenna 13 has a sleeve opening 131, the sleeve opening 131 is provided with a recessed groove 132. The sleeve type antenna 13 is provided with an antenna 133, a feed end 1331 of the antenna 133 is received in the recessed groove 132.

After the earphone header 12 and the sleeve type antenna 13 are assembled, the protruding portion 1211 of the conductive terminal 121 need to be pressed on the feed end 1331 of the antenna 133 to establish an electrical connection. Therefore, when the earphone header 12 and the sleeve type antenna 13 are assembled, it must make the protruding portion 1211 of the conductive terminal 121 aligned with the feed end 1331 of the antenna 133 firstly, and then assembled. Due to the need for alignment, the assembling between the earphone header 12 and the sleeve type antenna 13 is not easy. Moreover, since a size of the earphone plug 1 is too small, a size of the protruding portion 1211 of the conductive terminal 121 and a size of the feed end 1331 of the antenna 133 are also small, which makes the protruding portion 1211 of the conductive terminal 121 not easily aligned with the feed end 1331 of the antenna 133, thereby making the assembling more difficult. Moreover, the earphone header 12 and the sleeve type antenna 13 are electrically connected in the pressing manner, it is easy to make the protruding portion 1211 of the conductive terminal 121 get loose of or disengaged with the feed end 1331 of the antenna 133 to result in a poor contact due to a force applied to the earphone plug 1 from hit.

The protruding portion 1211 of the conductive terminal 121 and the feed end 1331 of the antenna 133 may be soldered or adhered. However, a holding force between the protruding portion 1211 and the feed end 1331 with soldering or adhering is not sufficient, so when the conductive terminal 121 is subject to a force and is declined, it is easy to make the conductive terminal 121 and the antenna 133 get loose or disengaged at the soldered point or the adhered point to result a poor contact. Moreover, since the protruding portion 1211 of the conductive terminal 121 and the feed end 1331 of the antenna 133 are temporally lapped together before the soldering, when the conductive terminal 121 is subject to a slight hit, it is easy for the protruding portion 1211 to be moved and disengaged with the feed end 1331, thereby resulting a poor contact between the conductive terminal 121 and the feed end 1331 after they are assembled.

SUMMARY OF THE PRESENT DISCLOSURE

An electrical connector comprises a body, at least one trace, at least one terminal and at least one engaging element.

The body comprises at least one recessed groove. The at least one trace comprises a first contact portion and a connection segment. The first contact portion is formed on a surface of the body and connected to the connection segment. The connection segment is formed on an inner surface of the recessed groove. The at least one terminal corresponds to the at least one trace. The terminal is fixedly provided to the body and comprises a second contact portion. A part of the terminal is exposed in the recessed groove. The second contact portion extends out of the body. The at least one engaging element electrically connects the connection segment and the terminal.

DETAILED DESCRIPTION OF THE PREFERRED EMBODIMENTS

Figure 1:
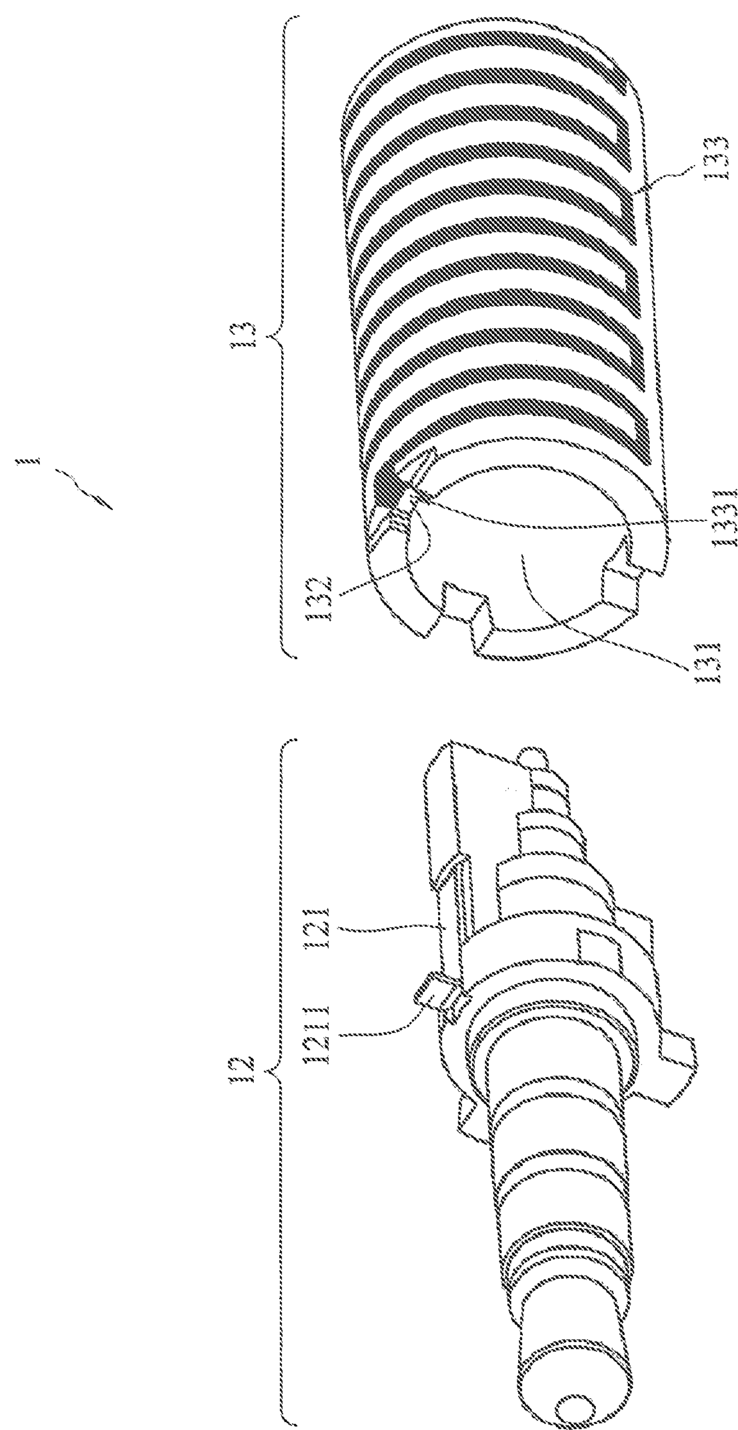
FIG. 1 is an earphone plug with an antenna disclosed by Taiwanese Utility Model application, publication number of which is M391240.
Figure 2:
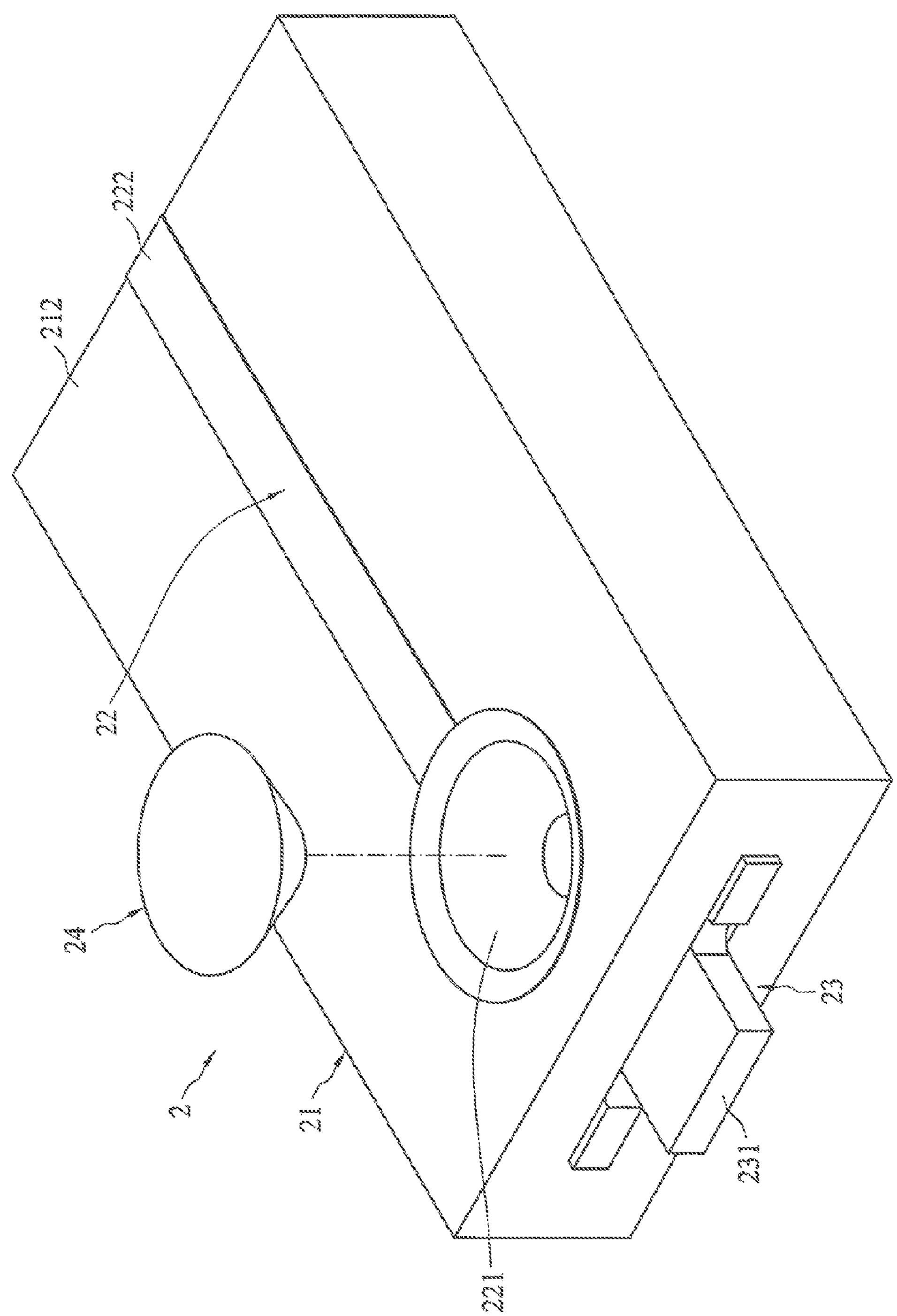
FIG. 2 is a perspective view of an embodiment of an electrical connector.
Figure 3:
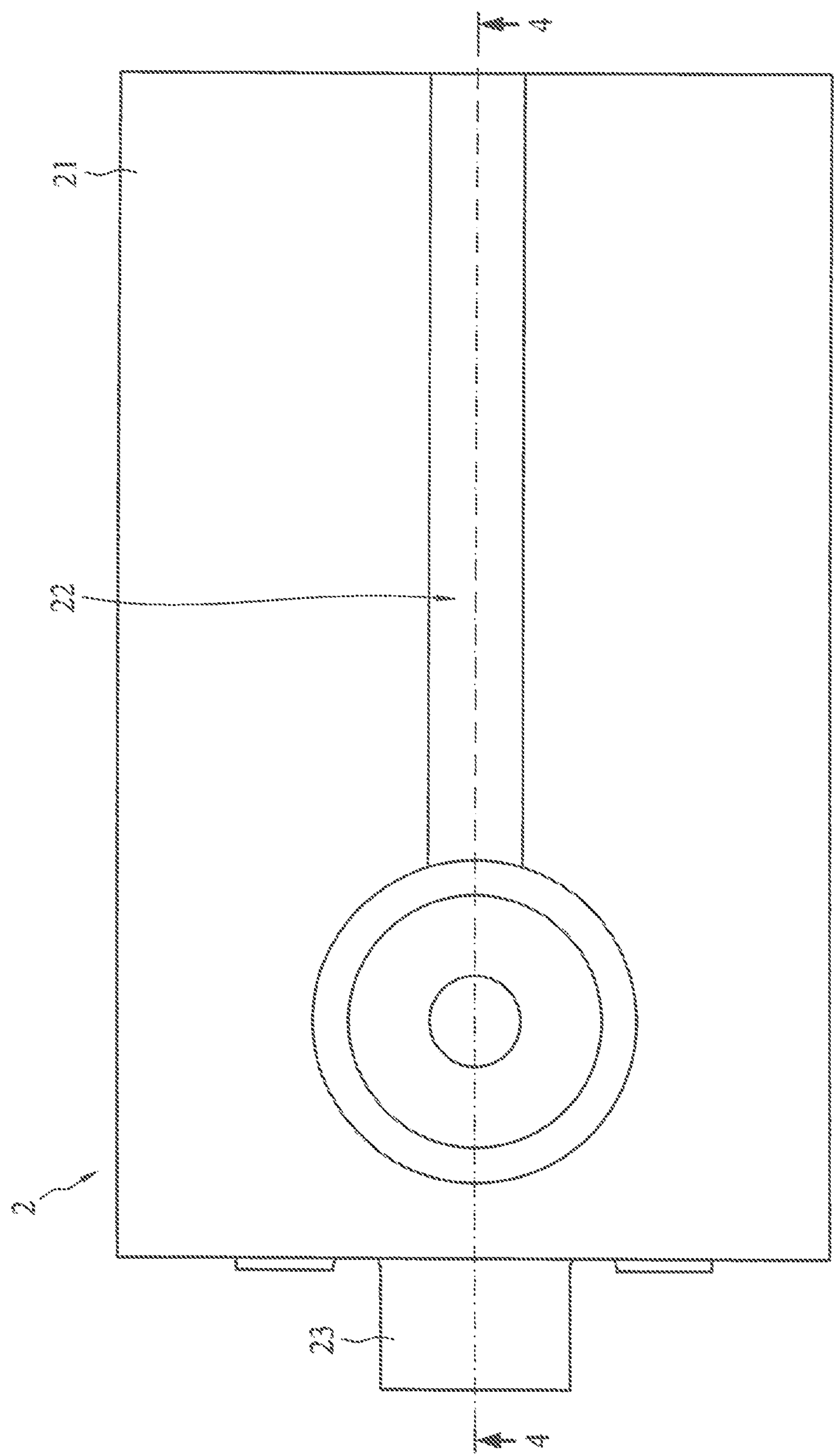
FIG. 3 is a top view of an embodiment of an electrical connector.
Figure 4:
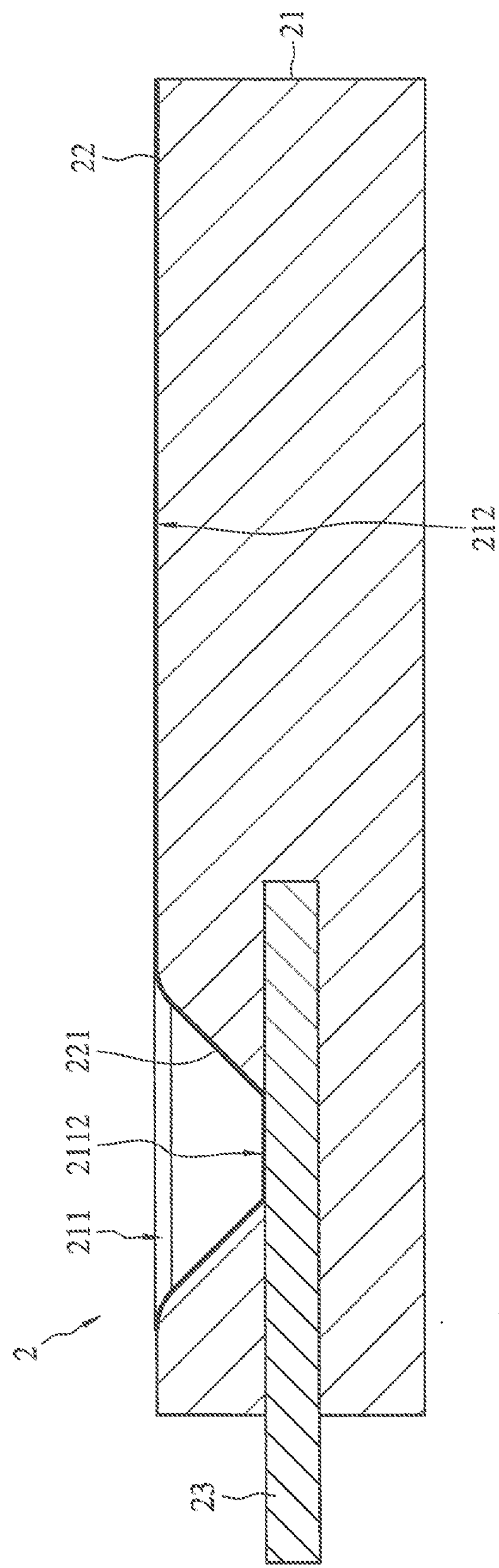
FIG. 4 is a cross-sectional view taken along a line 4-4 of FIG. 3.

Hereinafter embodiments of the present disclosure will be described in details in combination with the drawings. A depicted electrical connector electrically connect the trace and the terminal by the recessed groove and the engaging element formed in the recessed groove, thus it can securely connect the trace and the terminal, and can ensure a good electrical connection between the trace and the terminal, and will not result in a problem that the terminal and the trace get loose or are disengaged at the connection point therebetween to form a poor contact due to a force applied. Moreover, once the terminal is fixed to the body, the terminal will be aligned with the recessed groove, therefore the terminal does not need to be aligned during assembling, and the terminal can be easily assembled. In addition, since the terminal is fixedly connected to the body, it will not result in a problem that the terminal is moved due to a hit on the terminal.

In an embodiment, the trace comprises a metal plating layer. The body can include a shallow groove with the trace positioned in the shallow groove. The metal plating layer can comprise a laser direct structuring metal layer. In an embodiment the recessed groove extends inwardly from the surface of the body and an end of the recessed groove is formed with an inner opening, the inner opening facing the terminal. In an embodiment, the recessed groove is a tapered aperture which is wide outside and narrow inside. In addition, the body can include at least one terminal groove where the recessed groove extends to the terminal groove.

As can be appreciated, the terminal can include a base portion and a fixed portion, the second contact portion extends from the base portion, wherein the fixed portion is connected to the base portion and forms an interference fit with the terminal groove and the recessed groove is formed correspondingly to the base portion. A base portion comprises a hole, the recessed groove is formed correspondingly to the hole of the base portion and the engaging element can include a solder or a conductive adhesive.

In the electrical connector, in an embodiment, the trace, the engaging element and the terminal are provided as two in number, the two terminals are provided at opposite two sides of the body respectively, the each engaging element electrically connect the corresponding trace and the corresponding terminal. Each terminal can include a resilient arm and the resilient arms of the two terminals can clamp an electronic device or a battery.

Hereafter, the beneficial effects of the present disclosure will be described in combination with above technical solutions.

Referring to FIGS. 2-5, an electrical connector 2 comprises a body 21 (formed of an insulative material), a trace 22 (which is formed of a conductive material), a terminal 23 (formed of a metal alloy), and an engaging element 24. The terminal 23 is partially received in the body 21, and the trace 22 is formed on an outer surface of the body 21 and electrically connected to the terminal 23.

As can be appreciated, the terminal 23 is fixedly provided to the body 21. The body 21 comprises a recessed groove 211, the recessed groove 211 is formed correspondingly to the terminal 23, and recessed into the body 21 so that a part of the terminal 23 is exposed in the recessed groove 211. The trace 22 comprises a connection segment 221, the connection segment 221 is formed on an inner surface 2111 of the recessed groove 211.

In an embodiment, the recessed groove 211 of the body 21 may be positioned at a surface 212 (which may be one surface of the out surface of the body 21) of the body 21, and extend inwardly from the surface 212. An end of the recessed groove 211 is formed with an inner opening 2112, the inner opening 2112 faces the part of the terminal 23 in the body 21. As depicted, the recessed groove 211 of the body 21 may be a tapered aperture which is wide outside and narrow inside, but the present disclosure is not limited to such a construction.

The engaging element 24 corresponds to the trace 22 or the terminal 23. The engaging element 24 electrically connects the terminal 23 and the trace 22 (or the connection segment 221). The engaging element 24 may be formed in the recessed groove 211 of the body 21, and contact to the part of the terminal 23 exposed in the recessed groove 211 and the connection segment 221 of the trace 22 at the same time. The engaging element 24 may be fixedly connected to the trace 22. The engaging element 24 may be fixedly connected to the terminal 23. The engaging element 24 may be fixed in the recessed groove 211 of the body 21. In an embodiment, the engaging element 24 comprises a solder. In another embodiment, the engaging element 24 comprises a conductive adhesive. In an embodiment, the engaging element 24 may be formed during laser welding of the terminal 23 and the connection segment 221 of the trace 22.

As can be appreciated, the trace 22 may include a first contact portion 222 and the first contact portion 222 is connected to the connection segment 221. The first contact portion 222 may be used to electrically connect a circuit board or an electronic member. The first contact portion 222 may be formed on the surface 212 of the body 21 where the recessed groove 211 is presented.

The terminal 23 corresponds to the trace 22. The terminal 23 may comprise a second contact portion 231. The second contact portion 231 extends out of the body 21. The second contact portion 231 may be used to electrically connect a circuit board or an electronic member.

In an embodiment, the first contact portion 222 of the trace 22 and the second contact portion 231 of the terminal 23 may be positioned at different side faces of the body 21. As can be appreciated, the trace 22 may comprise a metal plating layer. In an embodiment, the trace 22 may be formed by using molded interconnect device (MID) technology.

Figure 5:
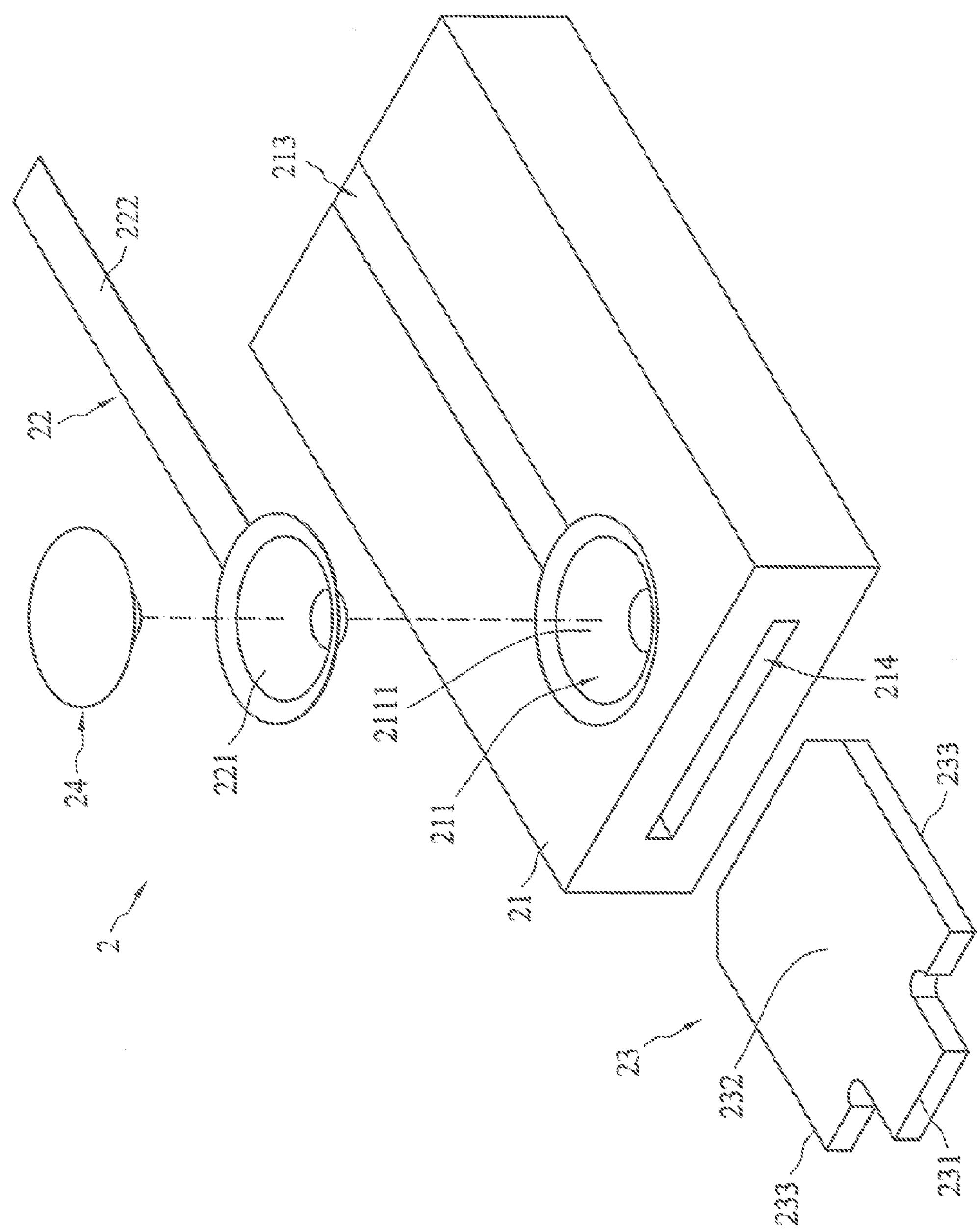
FIG. 5 is a exploded perspective view of an embodiment of electrical connector which illustrates a body, a trace, a terminal and an engaging element.

Referring to FIG. 5, in an embodiment, the body 21 may be made by a mixture of polymer material and metal additive, the metal additive is sensitive to laser. The metal additive may be metal complex or organic metal complex. A pattern for forming the trace 22 is formed on the body 21 by laser. A surface under laser radiation will be etched to form a shallow groove 213. A bottom surface of the shallow groove 213 is a coarse surface. The metal additive is activated under laser radiation to perform physicochemical reactions and produce metal particles embedded into the coarse bottom surface. These metal particles may be acted as metal nuclei of crystal growth in a metal deposition technology. After the pattern is formed by the laser, the body 21 may be placed into a plating solution, thus a laser direct structuring layer as the trace 22 may be plated on the shallow groove 213.

The body 21 may comprise a terminal groove 214. The terminal 23 may be inserted into the terminal groove 214. The recessed groove 211 of the body 21 may extend to the terminal groove 214, and is communicated with the terminal groove 214. In another embodiment, the terminal 23 may be fixedly connected to the body 21 in an insert mold manner.

The terminal 23 may comprise a base portion 232 and a fixed portion 233. The second contact portion 231 may extend from the base portion 232. The fixed portion 233 may be connected to the base portion 232. The base portion 232 may be at least partially received in the terminal groove 214, and the fixed portion 233 may form an interference fit with the terminal groove 214. In an embodiment, the recessed groove 211 of the body 21 may be formed by corresponding to or being aligned with the base portion 232 of the terminal 23, and thus the engaging element 24 may electrically connect the base portion 232 of the terminal 23 and the connection segment 221 of the trace 22.

Referring to FIGS. 6-10, an embodiment of an electrical connector 3 comprises a body 31, a plurality of traces 32, a plurality of terminals 33, and a plurality of engaging elements 34, the plurality of traces 32 correspond to the plurality of terminals 33, and correspond to the plurality of engaging elements 34.

Figure 9:
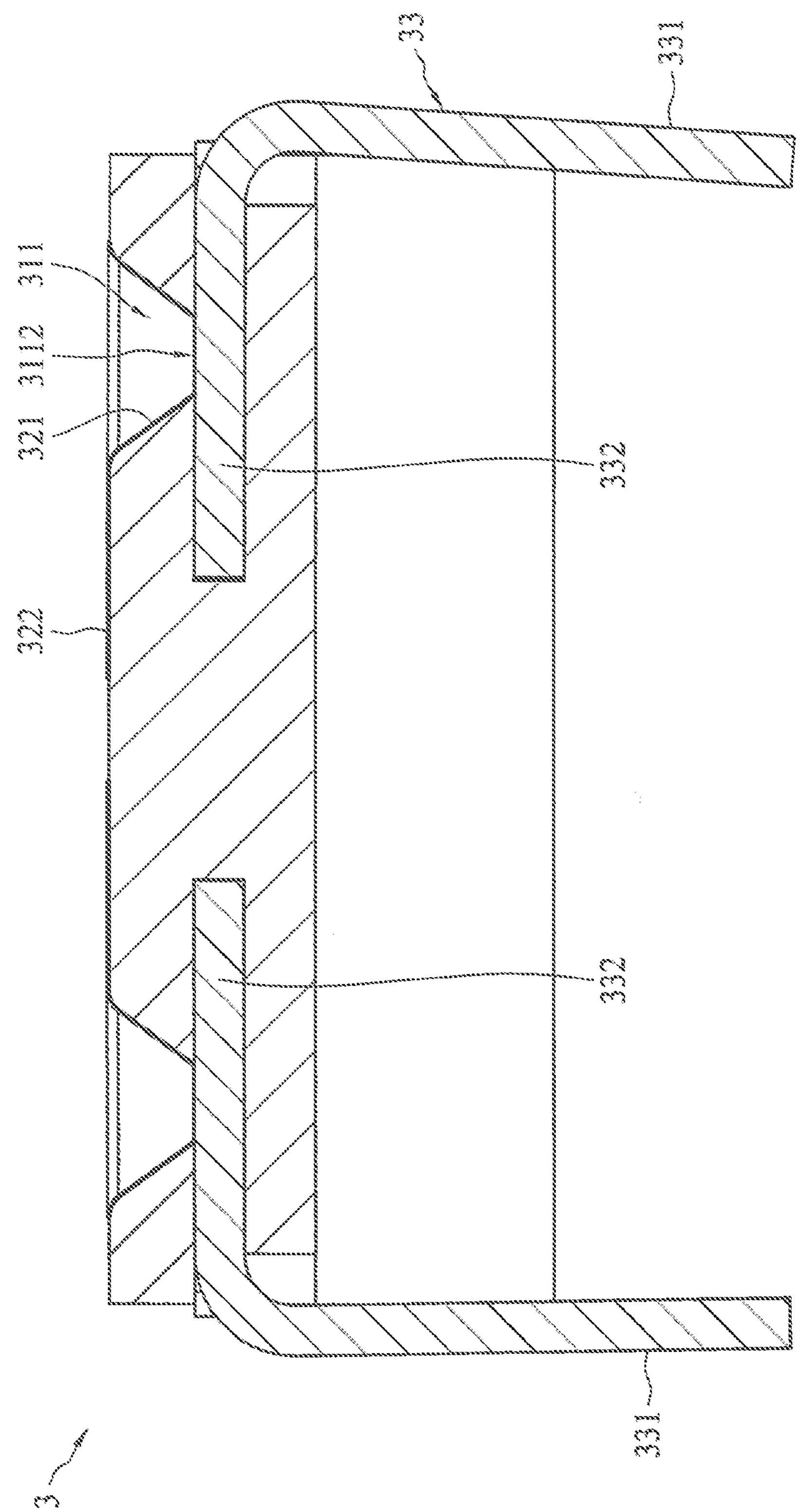
FIG. 9 is a cross-sectional view taken along a line 9-9 of FIG. 8.
Figure 10:
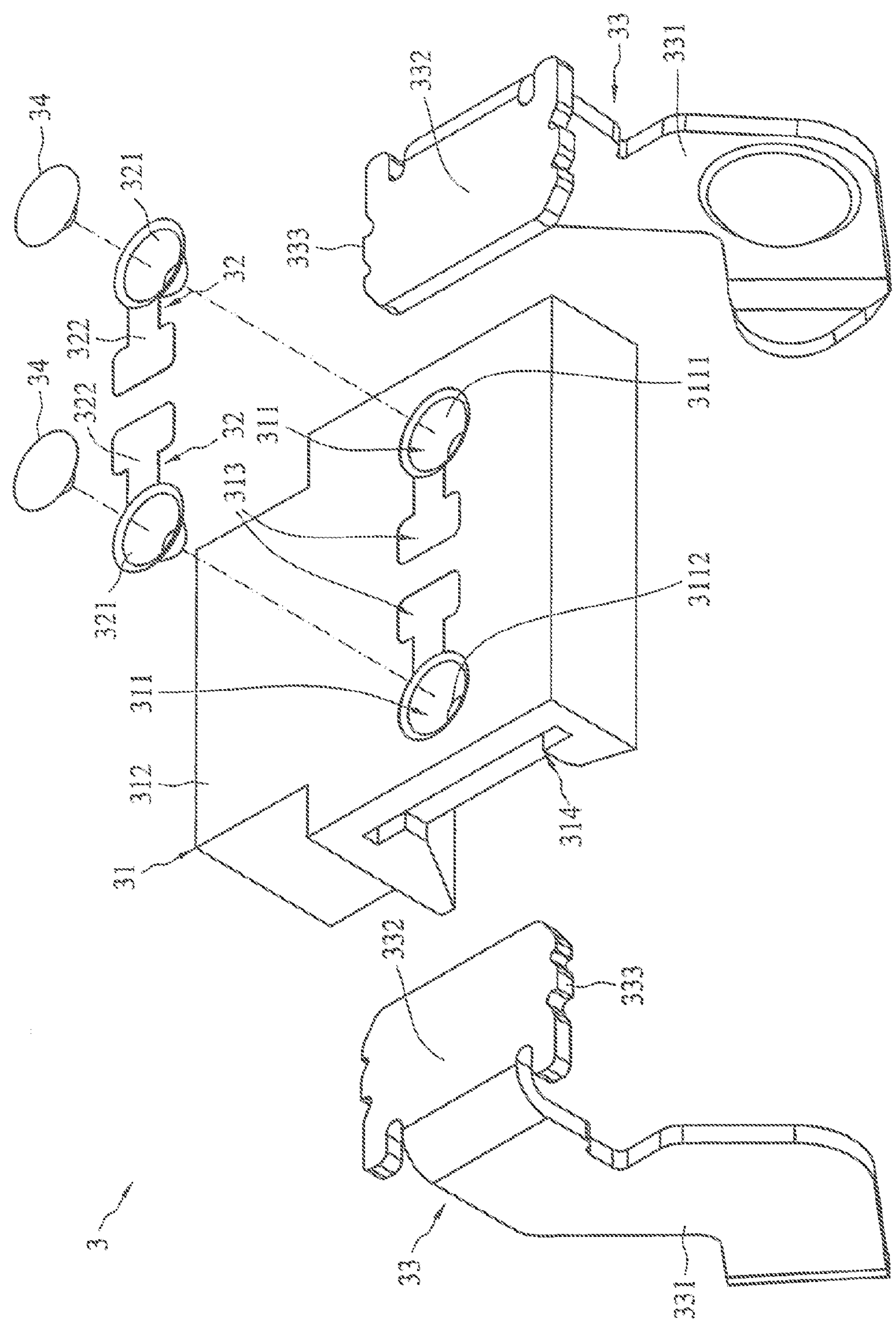
FIG. 10 is a perspective view of the another embodiment of the present disclosure which illustrates a body, a trace, a terminal and an engaging element in the electrical connector in an exploded way.

The plurality of terminals 33 may be fixedly provided to the body 31, the terminal 33 may be used to electrically connect a circuit board or an electronic member. The body 31 comprises a plurality of recessed grooves 311, a corresponding part of the terminal 33 is exposed in the each recessed groove 311, as shown in FIG. 9.

The trace 32 comprises a connection segment 321 and a first contact portion 322, the connection segment 321 is formed in an inner surface 3111 of the corresponding recessed groove 311. The first contact portion 322 is connected to the connection segment 321. The first contact portion 322 is used to electrically connect a circuit board or an electronic member.

The engaging element 34 may be provided in the corresponding recessed groove 311, and electrically connect the part of the corresponding terminal 33 exposed in the recessed groove 311 and the connection segment 321 of the corresponding trace 32.

The engaging element 34 may be fixedly connected to the trace 32. The engaging element 34 may be fixedly connected to the terminal 33. The engaging element 34 may be fixed in the recessed groove 311. In an embodiment, the engaging element 34 comprises a solder. In another embodiment, the engaging element 34 comprises a conductive adhesive. In an embodiment, the engaging element 34 may be formed during laser welding of the terminal 33 to the connection segment 321 of the trace 32.

In an embodiment the body 31 comprises a surface 312, the plurality of recessed grooves 311 may be positioned on the surface 312 and extend inwardly from the surface 312. An end of the each recessed groove 311 is form with an inner opening 3112, the inner opening 3112 faces the part of the terminal 33 in the body 31. The recessed groove 311 of the body 31 may be tapered aperture which is wide outside and narrow inside, but such a potential construction is not intended to be limiting.

In an embodiment, the first contact portion 322 is electrically connected to a circuit board or an electronic member. The first contact portion 322 may also be formed on the surface 312 of the body 31. As can be appreciated, the trace 32 may comprise a metal plating layer. In an embodiment, the trace 32 may be formed by using MID technology.

In an embodiment, the body 31 is made by a mixture of polymer material and metal additive where the metal additive is sensitive to laser. A shallow groove 313 is formed on the body 31 by using laser and this shallow groove 313 may be plated using a laser direct structuring layer to provide the trace 32.

Each terminal 33 may comprise a second contact portion 331. The second contact portion 331 extends out of the body 31. The second contact portion 331 may be used to electrically connect a circuit board or an electronic member. In an embodiment, the two terminals 33 are positioned at opposite two sides of the body 31 respectively. In an embodiment, the second contact portion 331 of the terminal 33 is a resilient arm, the resilient arms of the two terminals 33 are provided in a parallel but spaced away manner, and therefore the resilient arms of the two terminals 33 may clamp an electronic component such as electronic device or a battery.

As can be appreciated, the body 31 may comprise a plurality of terminal grooves 314, the plurality of terminal grooves 314 correspond to the plurality of terminals 33 and correspond to the plurality of recessed grooves 311. The each terminal 33 may be inserted into the corresponding terminal groove 314. The each recessed groove 311 is recessed downwardly from the surface 312 of the body 31 and may extend to the corresponding terminal groove 314 so as to be communicated with the terminal groove 314. In another embodiment, the terminal 33 may be fixedly connected to the body 31 in an insert mold manner.

The each terminal 33 may comprise a base portion 332 and at least one fixed portion 333. The second contact portion 331 of the terminal 33 may extend from the base portion 332. The fixed portion 333 may be connected to the base portion 332. The base portion 332 may be at least partially received in the corresponding terminal groove 314, and the fixed portion 333 may form an interference fit with the terminal groove 314. In an embodiment, the recessed groove 311 of the body 31 may be formed by being aligned with the base portion 332 of the terminal 33, and thus the engaging element 34 may electrically connect the base portion 332 of the terminal 33 and the connection segment 321 of the trace 32, as shown in FIG. 9.

Figure 6:
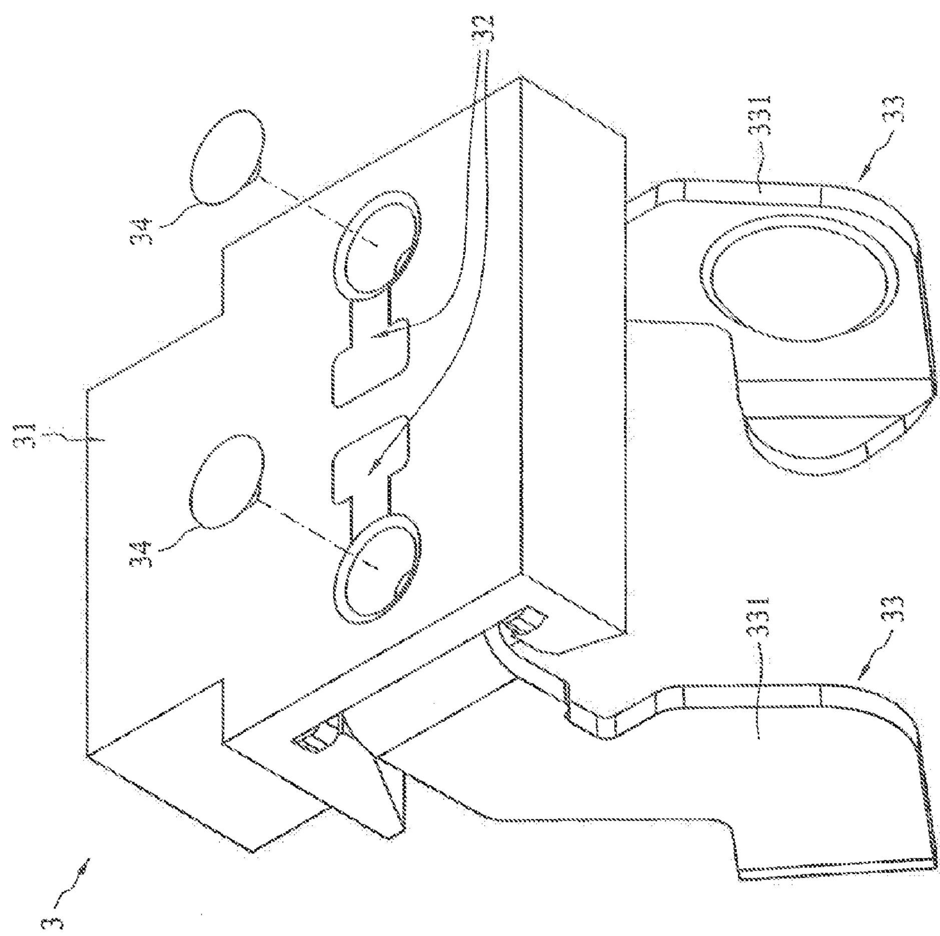
FIG. 6 is a perspective view of another embodiment of an electrical connector.
Figure 7:
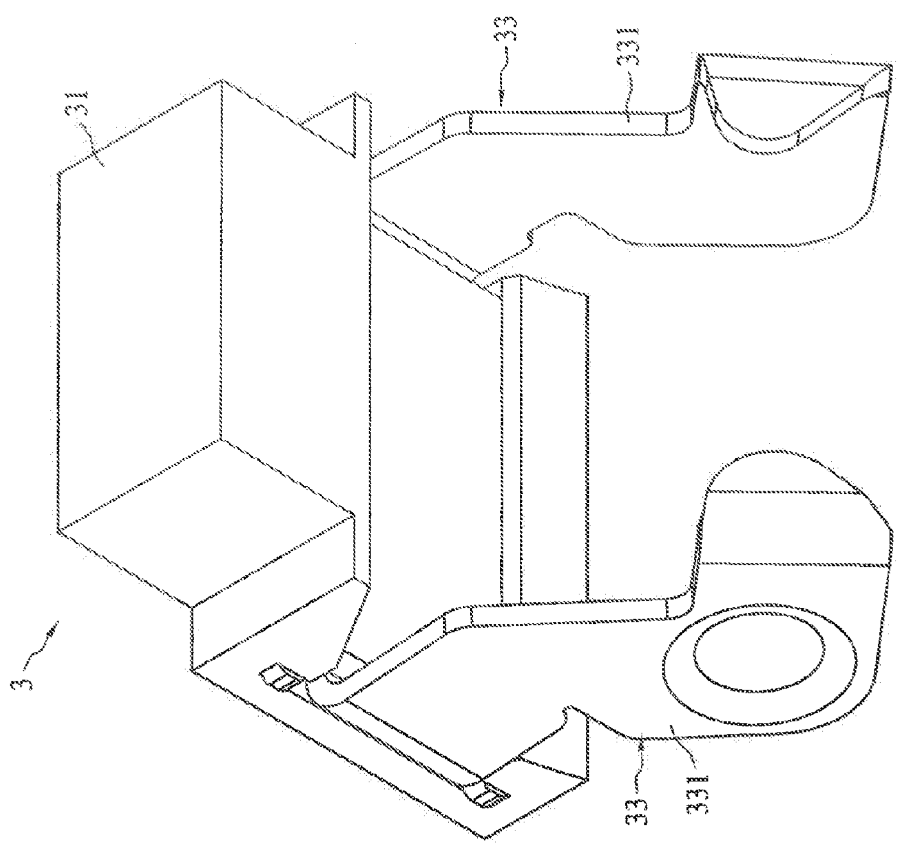
FIG. 7 is another perspective view of the embodiment depicted in FIG. 6.
Figure 8:
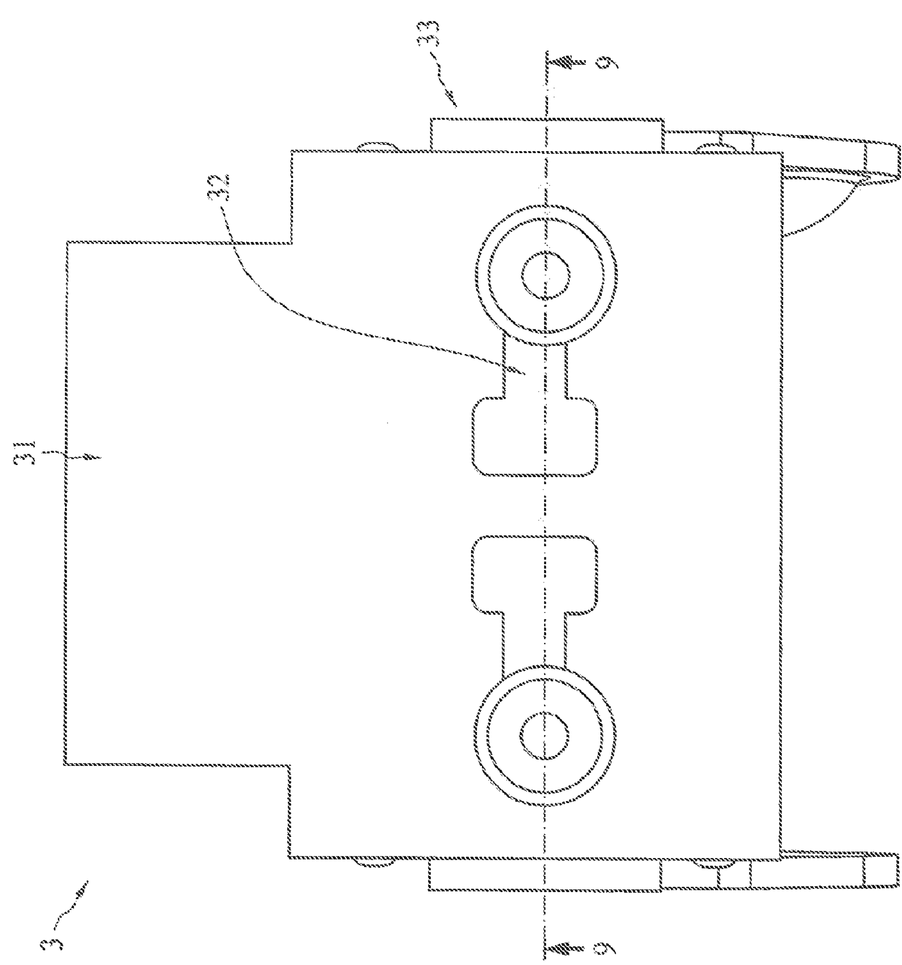
FIG. 8 is an elevated plan view of the electrical connector depicted in FIG. 6.
Figure 11:
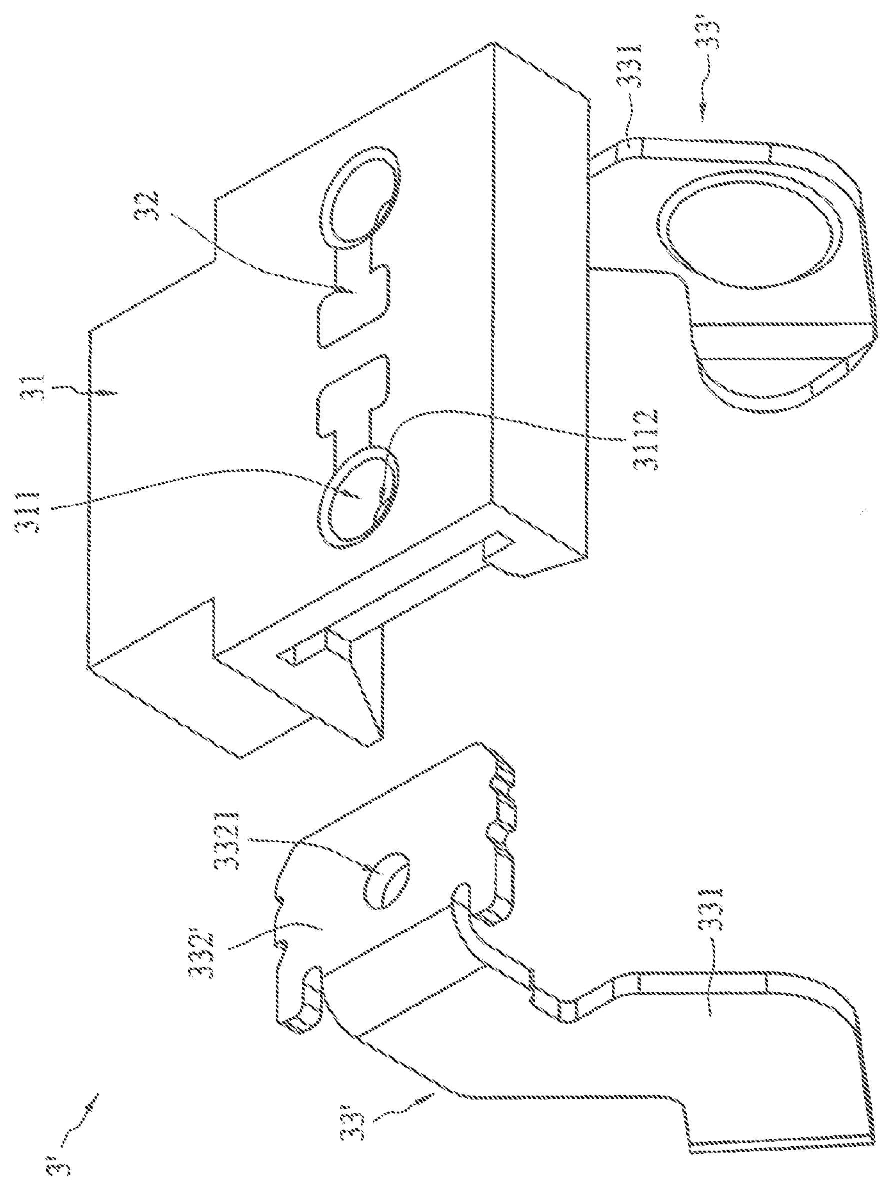
FIG. 11 is a perspective view of another embodiment of an electrical connector.
Figure 12:
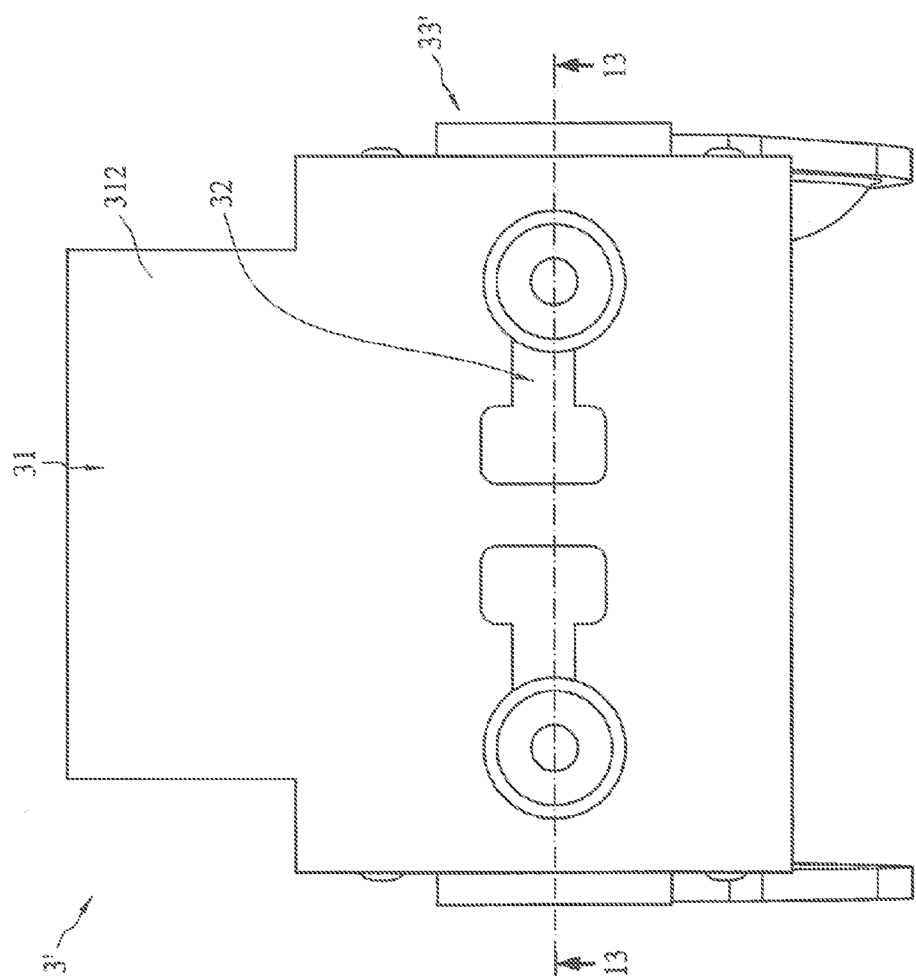
FIG. 12 is a plan view the electrical connector of the still another embodiment of the present disclosure.
Figure 13:
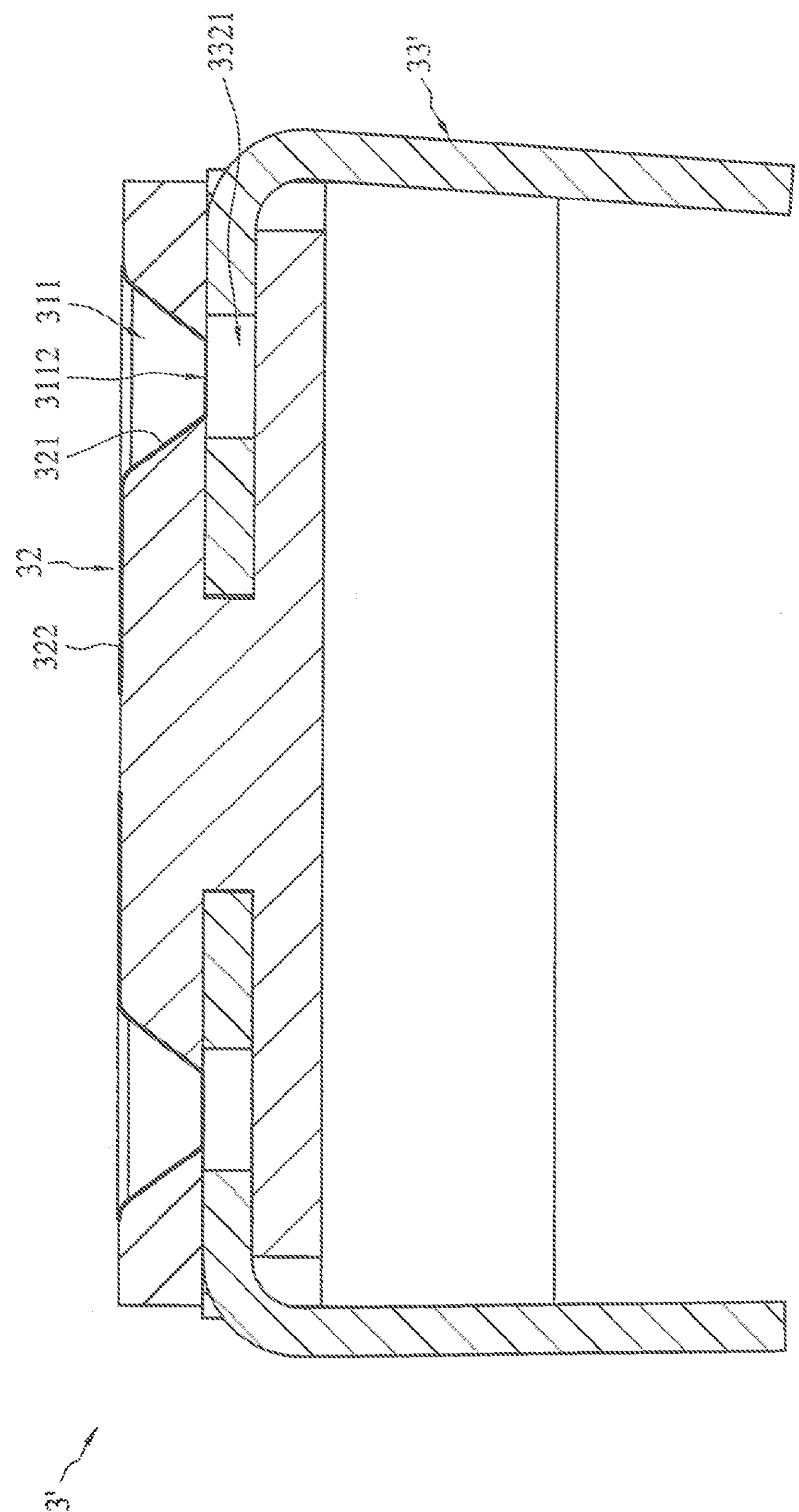
FIG. 13 is a cross-sectional view taken along a line 13-13 of FIG. 12.

Referring to FIGS. 11-13, an electrical connector 3' illustrated in FIG. 11 is similar to the electrical connector 3 illustrated in FIG. 6, a difference lies in that a base portion 332' of a terminal 33' of the electrical connector 3' in FIG. 11 comprises a hole 3321.

In an embodiment, the base portion 332' of the each terminal 33' has the hole 3321, which may be a through-hole. In an embodiment, as shown in FIG. 13, a recessed groove 311 of the body 31 may be provided by being aligned with the corresponding hole 3321, thus a part of an engaging element 34 is positioned in the hole 3321, and the other part of the engaging element 34 is positioned in the recessed groove 311. In an embodiment, an inner opening 3112 of the recessed groove 311 is smaller than the hole 3321, so a contact area between the engaging element 34 and the base portion 332' of the terminal 33' may be larger, thereby increasing the holding force; moreover, the engaging element 34 may be clamped so as to secure the engaging element 34.

An electrical connector of an embodiment of the present disclosure comprises a body, a trace and a terminal. The terminal is fixedly provided to the body. The trace is formed on the body. The recessed groove is formed on the body, a part of the terminal is exposed in the recessed groove on the body. The trace extends into the recessed groove. An engaging element is formed in the recessed groove to make the trace and the terminal electrically connected. Since the terminal is fixed to the body, it will not result in a problem that the terminal will be moved or moved away from a prescribed assembled position after the terminal is hit. Furthermore, the recessed groove is formed at a position where the terminal is fixedly provided and will not change, once the terminal has been assembled, the terminal will be aligned with the recessed groove, and the terminal does not need to be assembled after alignment, and assembling of the terminal is easy. Moreover, with electrically connecting the trace and the terminal by the recessed groove and the engaging element formed in the recessed groove, it can securely connect the trace and the terminal, and can ensure a good electrical connection between the trace and the terminal, and will not result in a problem that the terminal and the trace get loose or are disengaged at the connection point therebetween to form a poor contact due to a force applied.

Technical contents and technical features of the present disclosure are disclosed as above, but person skilled in the art still may make various substitutions and modifications without departing from the spirit of the present disclosure based on the teaching and disclosure of the present disclosure. Therefore, the protection scope of the present disclosure should not be limited to the contents disclosed by the embodiments, but should include various substitutions and modifications without departing the present disclosure, and is covered by the appended Claims.

What is claimed is:

1. An electrical connector, comprising:

an insulative body comprising at least one recessed groove;

at least one conductive trace comprising a first contact portion and a connection segment, the first contact portion being formed on a surface of the insulative body and connected to the connection segment, and the connection segment being formed on an inner surface of the recessed groove;

at least one metal terminal corresponding to the at least one conductive trace, the metal terminal being fixedly provided to the insulative body and comprising a second contact portion, a part of the metal terminal being exposed in the recessed groove, and the second contact portion extending out of the insulative body; and at least one engaging element corresponding to the at least one conductive trace, the at least one engaging element being provided in the recessed groove and electrically connecting the connection segment and the metal terminal.

2. The electrical connector according to claim 1, wherein the conductive trace comprises a metal plating layer.

3. The electrical connector according to claim 2, wherein the insulative body comprises a shallow groove, the conductive trace is positioned in the shallow groove.

4. The electrical connector according to claim 3, wherein the metal plating layer comprises a laser direct structuring metal layer.

5. The electrical connector according to claim 1, wherein the recessed groove extends inwardly from the surface of the insulative body, an end of the recessed groove is formed with an inner opening, the inner opening faces the metal terminal.

6. The electrical connector according to claim 1, wherein the recessed groove is a tapered aperture which is wide outside and narrow inside.

7. The electrical connector according to claim 1, wherein the insulative body comprises at least one terminal groove, the recessed groove extends to the terminal groove.

8. The electrical connector according to claim 7, wherein the metal terminal comprises a base portion and a fixed portion, the second contact portion extends from the base portion, the fixed portion is connected to the base portion and forms an interference fit with the terminal groove, the recessed groove is formed correspondingly to the base portion.

9. The electrical connector according to claim 8, wherein the base portion comprises a hole, the recessed groove is formed correspondingly to the hole of the base portion.

10. The electrical connector according to claim 1, wherein the engaging element comprises a solder or a conductive adhesive.

11. The electrical connector according to any one of claims 1-10, wherein the conductive trace, the engaging element and the metal terminal are provided as two in number, the two metal terminals are provided at opposite two sides of the insulative body respectively, the each engaging element electrically connect the corresponding conductive trace and the corresponding metal terminal.

12. The electrical connector according to claim 11, wherein the each metal terminal comprises a resilient arm, the resilient arms of the two metal terminals can clamp an electronic device or a battery.

* * * * *